United States Patent [19]

Dibbern et al.

[11] Patent Number: 5,552,658
[45] Date of Patent: Sep. 3, 1996

[54] TORSIONAL ACTUATOR AND METHOD OF MANUFACTURING SAME

[75] Inventors: Uwe Dibbern, Hamburg; Joseph Pankert, Aachen, both of Germany

[73] Assignee: U.S. Philips Corporation, New York, N.Y.

[21] Appl. No.: 313,497

[22] Filed: Sep. 27, 1994

[30] Foreign Application Priority Data

Sep. 28, 1993 [DE] Germany .................... 43 32 966.7

[51] Int. Cl.$^6$ .................................................. H01L 41/08
[52] U.S. Cl. .................. 310/366; 310/328; 310/333; 310/367
[58] Field of Search ................................. 310/328, 333, 310/366, 367

[56] References Cited

U.S. PATENT DOCUMENTS

| Re. 27,116 | 4/1971 | Miller | 310/366 |
|---|---|---|---|
| 4,233,637 | 11/1980 | Kubota | 360/10 |
| 4,649,313 | 3/1987 | Ogawa et al. | 310/328 |
| 5,001,382 | 3/1991 | Umeda et al. | 310/328 |
| 5,159,266 | 10/1992 | Montgomery | 310/333 |
| 5,182,484 | 1/1993 | Culp | 310/328 |
| 5,225,731 | 7/1993 | Owen | 310/366 |
| 5,231,325 | 7/1993 | Tamai et al. | 310/328 |
| 5,248,912 | 9/1993 | Zdeblick et al. | 310/328 |
| 5,281,899 | 1/1994 | Culp | 310/328 |

FOREIGN PATENT DOCUMENTS

| 0516175 | 12/1992 | European Pat. Off. | H01L 41/09 |
|---|---|---|---|
| 0182284 | 8/1986 | Japan | 310/366 |
| 0191085 | 8/1986 | Japan | 310/366 |
| 0239682 | 10/1986 | Japan | 310/366 |
| 8902658 | 3/1989 | WIPO | H01L 41/08 |
| 8907258 | 8/1989 | WIPO | H01L 41/08 |

*Primary Examiner*—Thomas M. Dougherty
*Attorney, Agent, or Firm*—Leroy Eason

[57] ABSTRACT

A torsional actuator consisting of multilayers of monolithic piezo-electric ceramic material, with planar electrodes between the successive layers and external contacts for supplying control voltages to the electrodes which cause the actuator to twist about its longitudinal axis by a torsion angle dependent on the control voltages. Viewed in cross-section, and with respect to a reference potential supplied to alternate ones of the electrodes, the remaining electrodes are in four respective quadrants and are supplied with control voltages of polarities dependent on the quadrants in which they are located.

8 Claims, 4 Drawing Sheets

TORSIONAL ACTUATOR AND METHOD OF MANUFACTURING SAME

BACKGROUND OF THE INVENTION

The invention relates to a torsional actuator and to a method of manufacturing said actuator.

Torsional actuators are known per se. A torsional actuator is a piezo-electric actuator whose end portion is twisted through a small angle under the influence of an electric field. Such a torsional actuator may be in the form of a cuboid with a rigidly secured rectangular rear surface whose dimensions are selected so that the torsional actuator is plate-shaped. If the torsional actuator is put into operation, the side opposite to the rigidly secured side is twisted about its longitudinal axis through the maximum angle of torsion.

In principle, a torsional actuator can be regarded as a combination of two adjacent piezo-electric bending actuators which are interconnected and which comprise electrodes. Torsion occurs when one of the bending actuators is bent in an upward direction while the other bending actuator is bent in a downward direction.

This basic construction is known from U.S. Pat. 4,233,637 in which a simple, cuboidal, single and dual layer bimorphous arrangement is described which can be used as a torsional actuator as well as a bending actuator. This simple bimorphous torsional actuator has the disadvantage that the large layer thicknesses require very high control voltages.

A further actuator is described in the PCT Patent Application WO 89/02658, said actuator being built up of piezo-electric polymer foils whose elastic and piezo-electric properties are such that their use for actuators is subject to certain conditions, because the forces or torques which can be generated are very small. The polymer foils also have a preferred direction in the plane of the layer, which preferred direction is used to attain complicated deformations with simple undivided electrodes. However, only a part of the material or only a few layers of the overall quantity of material can be active, so that the forces which can be generated at a specific volume are relatively small.

SUMMARY OF THE INVENTION

It is an object of the invention to provide a torsional actuator of a simple construction which already exhibits a large angle of torsion at small control voltages, which can suitably be used in the field of machine tools and/or to control video heads, and which can be manufactured at low cost in a simple manufacturing process.

The plate-shaped torsional actuator in accordance with the invention is basically manufactured from a monolithic block of piezo-electric ceramic and is provided with inner electrodes and external head contacts to which control voltages are applied.

By virtue of the fact that the inventive torsional actuator is constructed as a multilayer actuator, the following advantages are attained: large angles of torsion can be generated by small voltages, and the torsional actuator can be used as a positioning element in the field of machine tools or to control video heads (track following system). In comparison with the above-mentioned Patent Application WO-89/02658, the torsional actuator in accordance with the invention can, for example, generate relatively large forces or torques.

In accordance with a particular embodiment of the invention, a lower or upper outer electrode can be provided in addition to the inner electrodes, said outer electrode being arranged at a distance from the outer edge of the relevant piezoelectric layer. To contact said outer electrodes, advantageously, a section is provided which extends as far as the outer edge of the piezo-electric layer, where said section can bring these electrodes into contact, groupwise, with other electrodes in a specific manner. In accordance with the invention, said contacts are established via head contacts which are laterally arranged on the torsional actuator and which enable a contact to be established such that a twisting of the torsional actuator about its longitudinal axis is obtained. It is alternatively possible that the outer electrodes totally cover the layers. In such an advantageous embodiment, the contact surfaces can be electrically separated from the rest of the edge by means of a recessed portion.

By means of imaginary centre lines, the end face of the cuboidal torsional actuator can be divided into four quadrants of a cartesian system of coordinates. In accordance with the invention, twisting occurs when the voltages of the first electrodes in the quadrants 1 and 4 are equal and of a positive sign and when the voltages in the quadrants 2 and 3 are equal and of a negative sign with respect to a reference voltage which is provided by at least one electrode in the imaginary horizontal centre line. The polarization of the adjacent piezo-electric layers is orthogonal to the central electrode and similarly oriented. Evidently, it is alternatively possible to reverse all signs. Alternatively, the voltages on the electrodes may be selected so as to be different when the polarization of the layers is changed. In that case, the multilayer torsional actuator in accordance with the invention is provided with electrodes which alternately point upwards and downwards with respect to said central electrode, the reference voltage also being applied to said electrodes, and the voltages applied to the electrodes arranged therebetween being such that they correspond to the voltages required by the relevant quadrant.

The electrodes are electrically divided into two parts by the longitudinal axis of the torsional actuator. All electrodes may be electrically divided into two parts; however, it is alternatively possible that the electrodes to which a reference voltage is applied are of undivided construction. This represents a particular embodiment of the invention.

As mentioned above, in accordance with a particular embodiment of the invention, it is alternatively possible to provide also the lower and upper external surfaces with electrodes which activate the underlying piezo-electric ceramic layer and which serve as an electric shield, provided that said electrodes are at the reference voltage.

Surprisingly, it has been found that a theoretical calculation corresponds quite accurately to the experiments carried out, so that the geometry of the torsional actuator which is cuboidal, per se, can be optimized in a very advantageous manner. For example, starting out from a predetermined charge constant, the possible angle of torsion increases as the thickness or height decreases. However, inter alia, stability limits have been defined. Surprisingly, it has been found that the ratio of the greatest length to half the width of the torsional actuator should advantageously range between 1 and 3. If, however, on the basis of constructional data for the area where the actuator is used, the maximum length of the torsional actuator is limited, while its width can still be freely selected, the angle of torsion can be maximized by choosing the ratio of the length to half the width to be approximately 0.9.

In accordance with a particular embodiment of the invention, it is further possible to improve the angle of torsion by deviating from the basic rectangular shape of the torsional actuator. For this purpose, a trapezoidal base is chosen, the wider end face of which can be moved and the width of which is twice that of the opposite side which serves as a support. By virtue thereof, the angle of torsion can be increased by approximately 33% with respect to the torsional actuator having a rectangular base.

By choosing different voltages, such as $U_1=U_2$ and $U_3=U_4$, the torsional actuator can be bent, so that the position of its longitudinal axis can be influenced, which is advantageous, in particular, for video-head control.

To generate the required voltages in the four quadrants, the inner electrodes require at least three different screen-printing masks.

In accordance with the invention, a method is provided which requires few screen-printing masks and which makes it possible, immediately upon the separation of a plurality of adjacently produced torsional actuators, to quasi-automatically provide the required contacts or connection surfaces, in the necessary groups, one on top of the other at the side faces of the torsional actuator where the relevant head contacts are provided. In accordance with a first mask arrangement, three different masks of different layout are used. After each printing operation the masks must be exchanged.

In accordance with a further embodiment of this method, the mask in question is repeated, for example, three times in a horizontal row. It is alternatively possible to repeat the mask in the vertical direction. The mask structure itself may be slightly changed, for example, by rotation or mirroring. Following the manufacture of a plurality of torsional actuators, the division into individual actuators can take place, for example, by cutting along predetermined parting lines. In this process, the connection surfaces for the external head contacts on the parting surfaces are exposed.

In order to reduce the number of (three) time-consuming mask-exchange operations of this first mask arrangement, a further embodiment of the inventive method provides an arrangement in which only two masks are used which are employed in two different positions each. Both positions are attained by moving the masks over half a width dimension of the actuator after each printing operation. Also in this case, the plurality of simultaneously manufactured actuators are subsequently separated from each other along predetermined parting lines, but said process requires only one mask-exchange operation. A disadvantage of this second mask arrangement is the fact that owing to the displacement a half mask surface is lost to the left or right of a row of masks.

Properly arranged connection areas ensure that the contacts with the head contacts are established. However, the reference connection area is present twice and hence requires two head contacts, which must subsequently be interconnected.

BRIEF DESCRIPTION OF THE DRAWING

The invention will be explained in greater detail by means of exemplary embodiments and with reference to the accompanying drawings, in which.

DETAILED DESCRIPTION OF PREFERRED EMBODIMENTS

Figure 1:
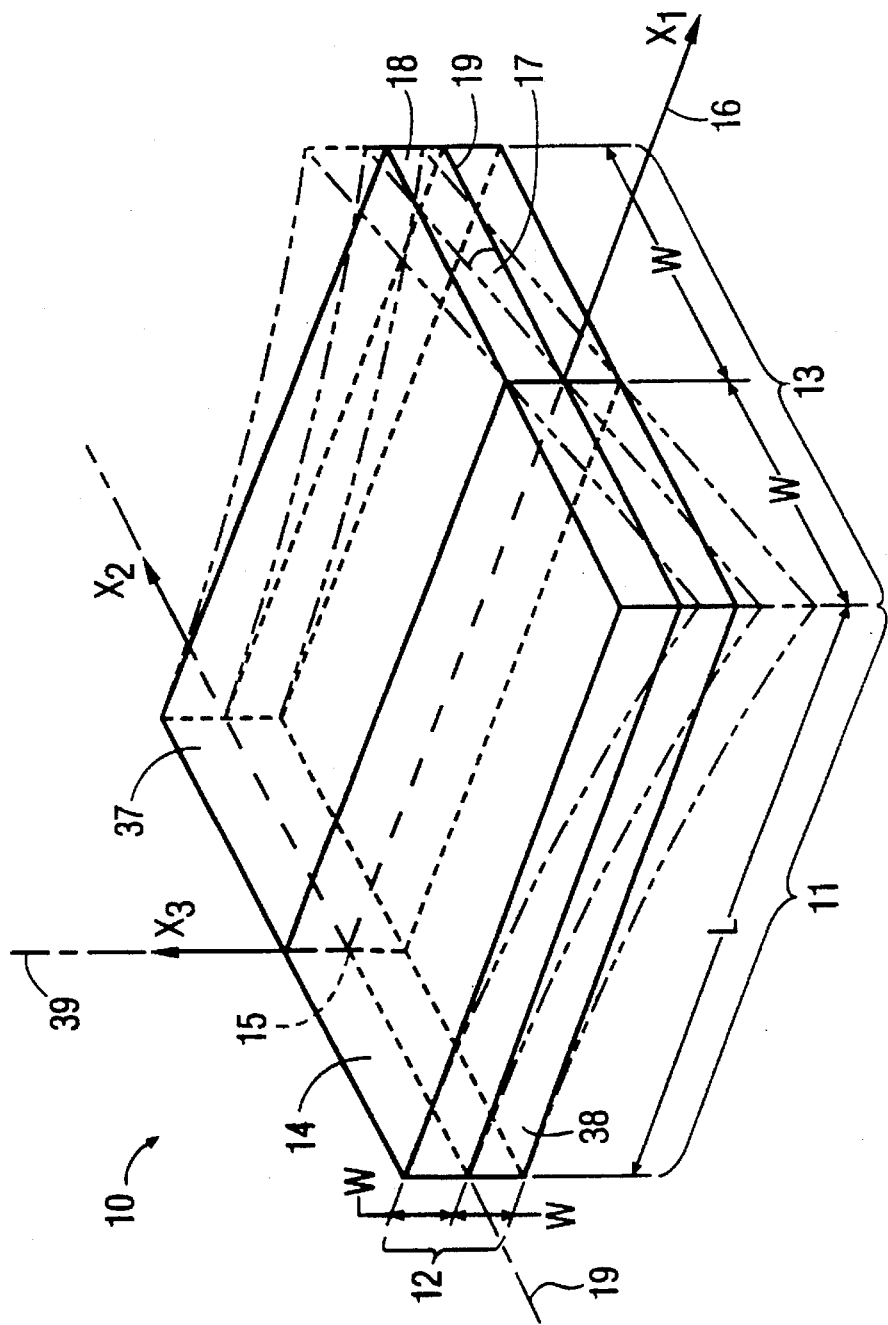
FIG. 1 is a perspective view of a torsional actuator in accordance with the invention.

FIG. 1 shows a torsional actuator 10 in accordance with the invention having a length 11, represented by L in the formula, a height or thickness 12, represented by 2w in the formula, and a width 13, represented by 2W in the formula. The centre 15 of the rear side face 14 of the torsional actuator 10 also constitutes the origin of a cartesian system of coordinates having the axes $x_1$, $x_2$ and $x_3$, where $x_1$ and $x_2$ are axes extending in the horizontal direction and $x_3$ is an axis extending in the vertical direction. The axis $x_1$ also constitutes the central longitudinal or torsional axis 16 of the torsional actuator 10. The largest angle of torsion in a direction of deflection is referenced 17 on the side 18 which is opposite to the side face 14, and said angle of torsion is represented by $Tw_r$ in the formula. Said angle may be a few degrees. The trajectory of the angle of torsion 17 shown in FIG. 1 extends between the horizontal centre lines 19 of the torsional actuator 10 represented by solid lines and the horizontal centre lines 19 of the twisted torsional actuator 10 represented by dot-dash lines. The angle of torsion 17 shown corresponds to the rotation of the torsional actuator 10, the direction of the rotation being caused by a specific polarity of the electrodes and piezo-electric layers of said actuator. A different polarity results in a twist in the opposite direction through the same angle 17. If the torsional actuator 10 is used, for example, for video-head control, or in the field of machine tools, the side face 14 must be rigidly positioned in the position shown in FIG. 1. It is noted, that the reverse mode of operation, i.e. the torsional actuator is not used as a positioning element but, for example, as a torque sensor, is also possible.

The dimensions of the cuboidal torsional actuator 10 are such that said actuator is plate-shaped. The side face 14 is rigidly provided. The torsional actuator is not twisted when no voltages are applied to the electrodes. If, however, suitable voltages are applied at a specific polarization of the layers 20, the torsional actuator is twisted about the axis $x_1$, the largest angle of torsion 17 being found at the vertex, i.e. where $x_1=L$.

Figure 2:
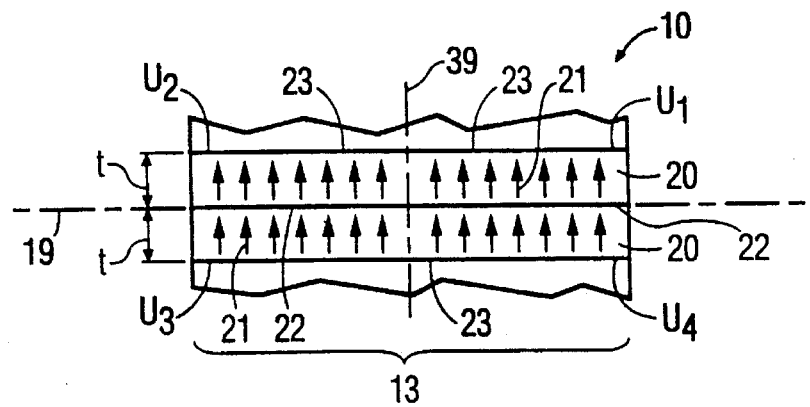
FIG. 2 is a detail of two central layers of the torsional actuator of FIG. 1, in a sectional plane subtended by the axes $x_2$ and $x_3$.

FIG. 2 is a cross-sectional view of the torsional actuator 10 shown in FIG. 1, in a plane subtended by the axes $x_2$ and $x_3$. For simplicity, only a bimorph is shown, i.e. the coating of two specifically polarized piezo-ceramic layers 20 of the thickness t. The transition from this bimorphous bending element to a multilayer bending element will be explained hereinbelow. The arrows 21 in the piezo-ceramic layers 20 indicate a possible direction of polarization. In principle, it is alternatively possible to select an opposite direction of polarization in one or more of the quadrants formed by horizontal and vertical the centre lines 19, 39. The behaviour of the torsional actuator 10 does not change when along with the polarization the applied voltage also changes sign. The central electrode 22, which may be divided into two parts or which may be in one piece, represents the reference potential or ground electrode. The other electrodes 23, however, are divided in two parts and hence do not electrically cross the vertical center line as seen in cross-section. The voltages in the four quadrants, which are the potentials applied to the electrodes 23 therein, are referenced $U_1$, $U_2$, $U_3$ and $U_4$ and determine the deformation of the torsional actuator.

A twisting in accordance with the invention takes place when, at specific polarization values in accordance with FIG. 2, for example, the voltages are selected to be $U_1=-U_2=-U_3=U_4$. Since the deformations depend linearly on the voltages, a combination of bending and twisting can be obtained by an unproblematic addition of the relevant voltages. Only bending occurs when, for example, $U_1=U_2=U_3=U_4$.

As mentioned in the opening paragraph, known bimorphous torsional actuators have the disadvantage that their control voltages are very high due to the large layer thickness. Said control voltages amount to several kilovolts. This disadvantage can be circumvented by the manufacture of multilayer actuators. A multilayer actuator, in accordance with the inventive torsional actuator 10, basically is a monolithic block of piezo-electric ceramic comprising inner electrodes 22 and 23, whose mutual contact as well as the contact with the control-voltage terminal is established via head contacts 30 to 34 (see FIG. 4).

Figure 3:
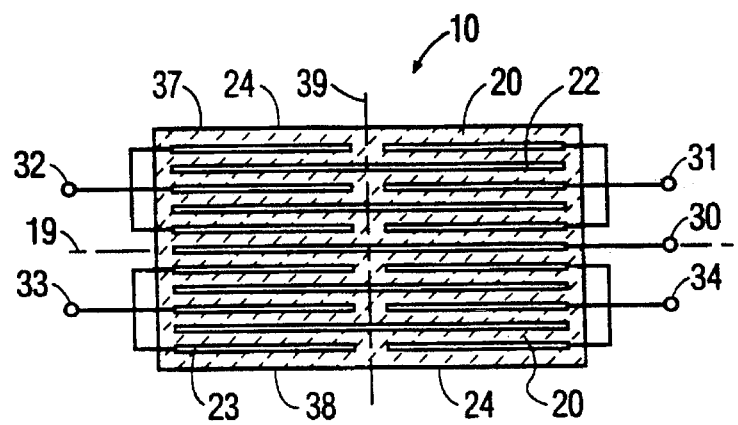
FIG. 3 is a diagrammatic sectional view in accordance with FIG. 2 of the electric contacting of an inventive torsional actuator.

FIG. 3 shows the basic circuitry of the head contacts 30 to 34 by means of a diagrammatic cross-sectional view of a plane of a torsional actuator 10 in accordance with FIG. 1, which plane is subtended by the axes $x_2$ and $x_3$. The piezo-electric ceramic layers 20 are represented by hatching lines and the inner electrodes 22 and 23 are represented by thick lines. In addition to the inner electrodes 22 and 23, the torsional actuator also comprises outer electrodes 24 which are connected to the head electrode 30. The inner electrodes 22 are also connected to the head electrode 30. The inner electrodes 22 and 23 shown in the left half of FIG. 3 are connected, viewed from the bottom to the top of the Figure, in the following manner: electrode 23 is connected to head contact 33, electrode 22 is connected to head contact 30, electrode 23 is connected to head contact 33, electrode 22 is connected to head contact 30, electrode 23 is connected to head contact 33, electrode 22 is connected to head contact 30, electrode 23 is connected to head contact 32, electrode 22 is connected to head contact 30, electrode 23 is connected to head contact 32, electrode 22 is connected to head contact 30, and electrode 23 is connected to head contact 32. The same principle applies to the right half of FIG. 3, with the difference that the head contact 33 must be replaced by the head contact 34 and the head contact 32 must be replaced by the head contact 31.

Figure 4:
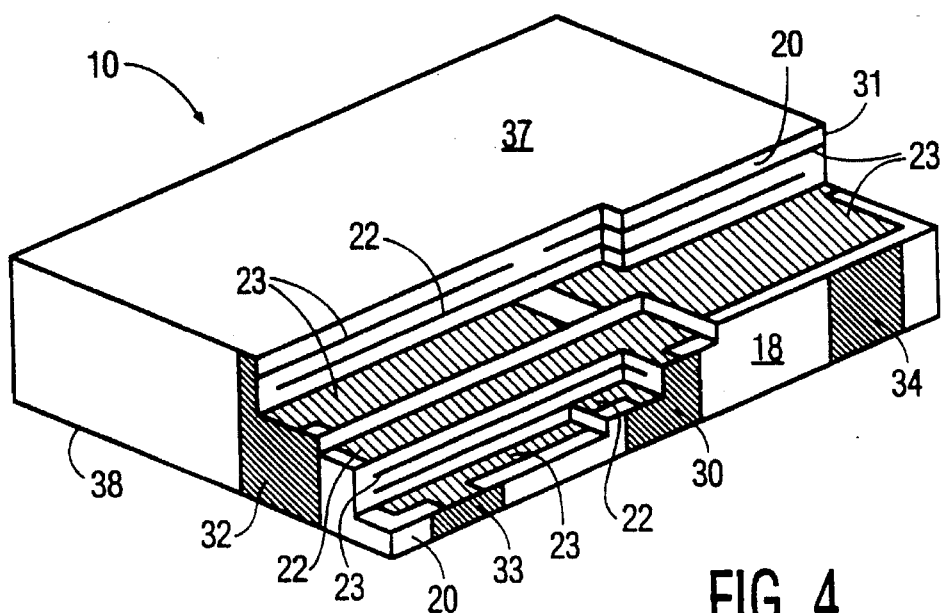
FIG. 4 is a perspective, partly cut-away and partly sectional, view of an inventive torsional actuator comprising a plurality of inner electrodes.

FIG. 4 is a perspective and partly cut-away view of the internal construction of the torsional actuator 10 in accordance with the invention. The five head contacts 30 up to 34 are clearly visible; head contact 30 corresponds to the reference electrode 22 in FIG. 1 and head contact 30 in FIG. 3. The head contact 31 represents the voltage $U_1$, the head contact 32 represents the voltage $U_2$, the head contact 33 represents the voltage $U_3$ and the head contact 34 represents the voltage $U_4$. The construction of the torsional actuator 10 illustrated in FIGS. 3 and 4 shows seven inner electrodes 22 and 23. Of course, it is alternatively possible to use more or fewer electrodes. The electrodes connected to the head contact 30 are not divided in the middle since this is not required for their functioning. The divided inner electrodes 23 in the upper half of the actuator are connected to the head contact 31 or 32 and in the lower half of said actuator they are connected to the head contact 34 or 33. It is further assumed in FIG. 4 that, apart from their connection to the relevant head contacts, the electrodes 22 and 23 are not led outwards.

The surfaces 37, 38 which constitute, respectively, the upper and lower bounding faces of the torsional actuator 10 shown in FIG. 4 do not comprise additional electrodes 24, as shown in FIG. 3. Consequently, the top ceramic layer or bottom ceramic layer 20 does not contribute to the torsion effect. However, the torsion effect can be enhanced by providing additional electrodes 24, both at the top and the bottom, which electrodes are to be connected to the head contact 30. If the head contact 30 is at ground potential, these outer electrodes 24 provide an additional shield.

In the case of a torsional actuator 10 whose geometry corresponds to that shown in FIG. 1 or FIG. 4, it has surprisingly been found in experiments that the following formula for calculating the angle of torsion 17 corresponds very accurately to reality. The angle of torsion 17, i.e. $Tw_r$, can be written as follows:

$$Tw_r = \frac{9}{8} \cdot \frac{(1+\sigma) \cdot d_{31} \cdot W/w \cdot L^2}{1+(1+\sigma) \cdot K^2/8] \cdot W^2 + 2 \cdot (1-\sigma) \cdot L^2} \cdot \frac{U}{w}$$

wherein U/w represents the field strength, σ is the Poisson ratio, $d_{31}$ is the charge constant of the material and $K^2=K_p^2/(1-K_p^2)$, wherein $K_p$ is the planar coupling coefficient. A geometrical optimization can be obtained by means of this expression. At a specific charge constant $d_{31}$, the angle 17 will increase with decreasing thickness; however, in this respect technological limits as well as mechanical stability are to be taken into account. A greater length L/W>1 is advantageous, but if L/W>3 a saturation of the angle of torsion occurs. If, however, L is limited and the width W can be freely selected, the angle $Tw_r$ can be maximized by choosing L/W to be approximately 0.9.

Figure 7:
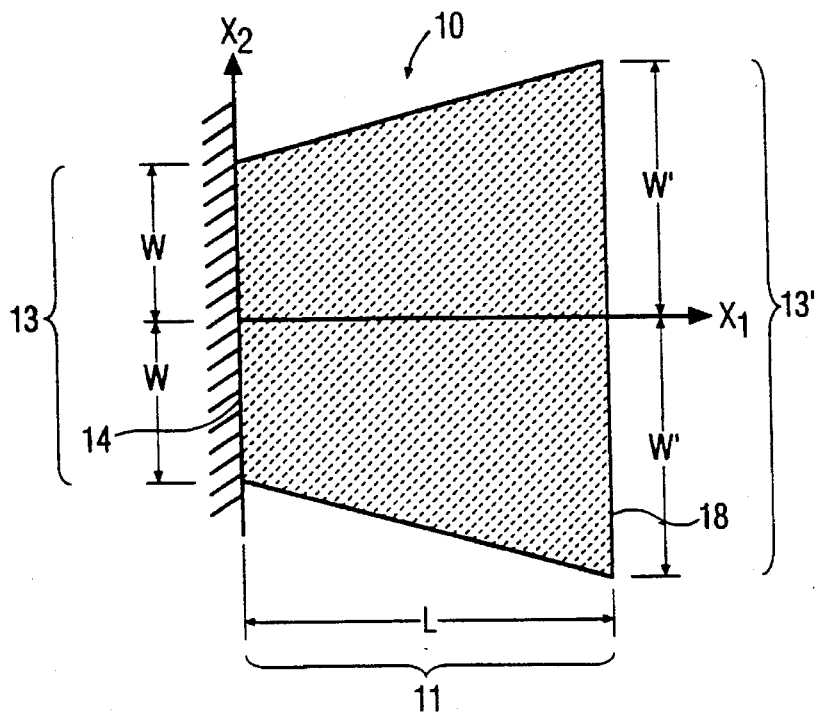
FIG. 7 is a top view of a torsional actuator in accordance with a further embodiment.

FIG. 7 is a top view of another embodiment of the torsional actuator 10 of FIG. 1, the side 14 having a maximum width 13 of 2W and the side 18 having a maximum width 13' of 2W'. W' is selected to be larger than W, so that the base of this variant of a torsional actuator 10 is trapezoidally shaped. Surprisingly it has been found that by selecting a trapezoidal base a further improvement, as compared to the customary rectangular base of the plate-shaped torsional actuator 10, can be obtained. Calculations and experiments show that the angle of torsion 17 can be increased by approximately 33% when W' is selected to be twice as large as W.

Below, a description is given of a particular process for simplifying the manufacture of the torsional actuator 10.

As shown in FIG. 4, the inner electrodes 22 and 23 are provided in three different planar arrangements and hence require three different screen-printing masks to establish contacts with the head contacts 30 to 34.

Figure 5:
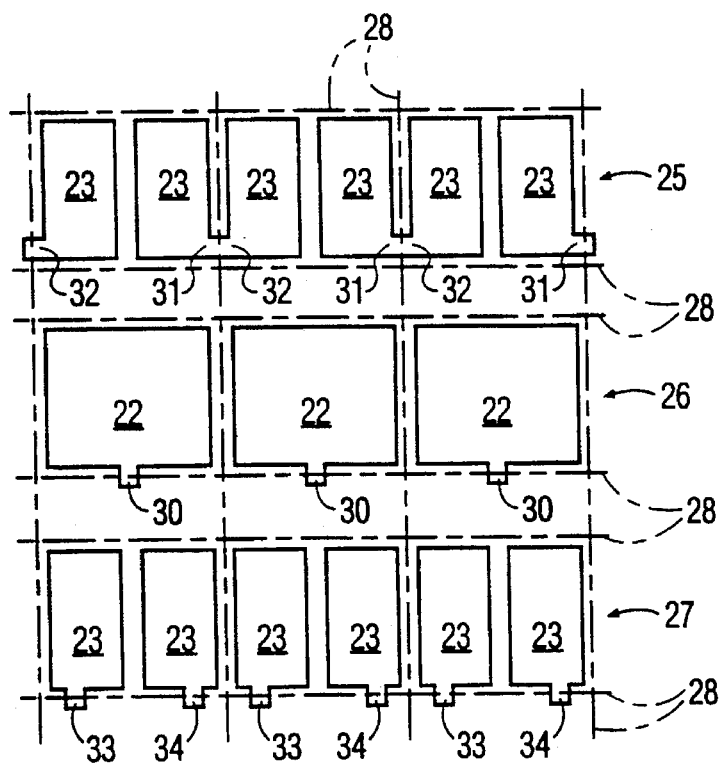
FIG. 5 is a first mask arrangement for the manufacture of a torsional actuator in accordance with the invention.

FIG. 5 shows a first mask arrangement comprising three different screen-printing masks 25, 26 and 27. A suitable mask sequence for the torsional actuator 10 of FIG. 4 would be, from top to bottom,: mask 27, mask 26, mask 27, mask 26, mask 25, mask 26 and finally mask 25, for the inner electrodes 22 and 23. If outer electrodes 24 are provided, they must be produced by means of the masks 26.

In the manufacturing process, another suitable mask sequence would be mask 25, 26, 25, 26, 25, . . . , mask 25, mask 26, mask 27, mask 26, . . . , mask 27. The masks must be exchanged after each printing process. As shown in FIG. 5, the masks 25 to 27 are arranged side by side and are equal in shape. Mask 25 comprises two rectangular centrally divided electrode sections 23, each having a lateral connection portion in FIG. 5, which portion, for simplicity, bears the same reference numeral as the corresponding head contact to which it is eventually connected. Mask 26 comprises an undivided section for the electrode 22 having, in FIG. 5, a central portion which extends downwards, which portion establishes the connection with the head contact 30. Mask 27 again comprises divided sections for the electrodes 23 which comprise, in the bottom left and bottom right portion of FIG. 5, a portion which establishes the connection with the head contacts 33 and 34. As shown in FIG. 5, the mask structure is repeated three times in each horizontal row. Of course, a repetition of an equally shaped mask structure in the vertical direction is alternatively possible. It is quite possible to slightly change the mask structure, for example, by rotation or mirroring. In a subsequent process step, the juxtaposed torsional actuators 10 are separated, for example, by cutting along the thick, dot-dash parting lines 28. Said parting lines 28 do not extend as far as the electrode surfaces 22 or 23, since, in accordance with the invention, only the connections to the outer head contacts 30 to 34 are exposed in accordance with the requirements, as shown in FIG. 4.

Figure 6:
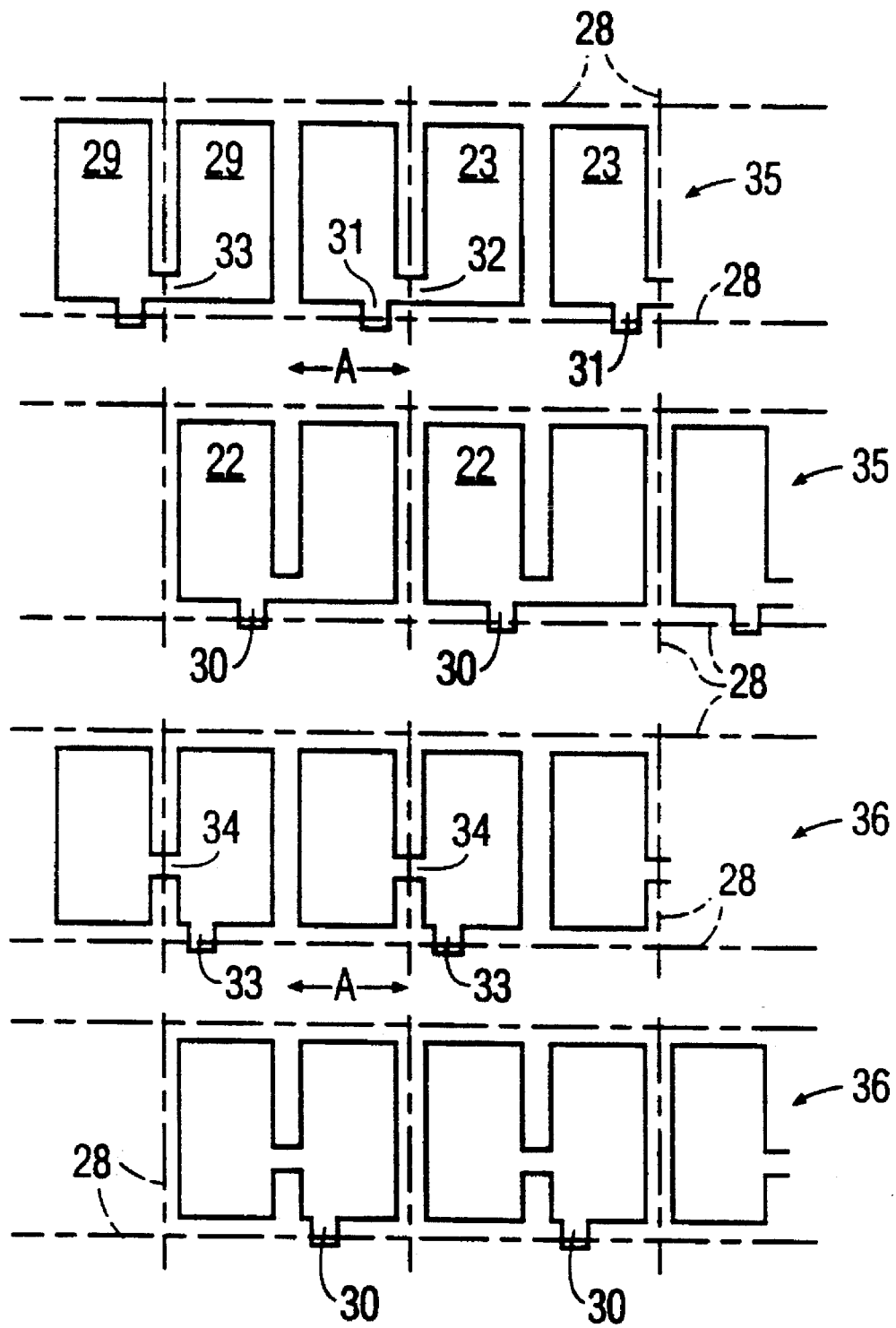
FIG. 6 is a second mask arrangement for the manufacture of a torsional actuator in accordance with the invention.

In order to reduce the manufacturing costs of the three different masks 25 to 27 and to further reduce the necessity of continually changing the masks, FIG. 6 illustrates a second mask arrangement in which only two different masks 35 and 36 are required. The masks, which are arranged next to each other like in FIG. 5, are shifted in the direction of the arrow A over half the width of the actuator along the horizontal parting line 28. That is, only two differently configured masks are used. Mask 35 comprises a base 29 having two electrode surfaces for each actuator half, said electrode faces being interconnected by means of a connecting element, and said base also comprises an electrode half, which is downwardly directed in FIG. 6, and which has a connection surface. By moving the parting lines in the direction of the arrow A, an electrode 22 or 23 can be produced. This is shown in the upper half of FIG. 6. The shape of the other electrode 36 is very similar to that of the mask 35, a connecting element, in a different position as compared to mask 35, interconnecting two halves of electrode surface, and a connecting portion, which is differently situated as compared to mask 35, being provided at the electrode half which does not have a lower connecting portion at mask 35, said connecting portion being downwardly directed in FIG. 6. As in FIG. 5, the connecting portions bear the same reference numerals as the head contacts 30 to 34.

The displacement must be carried out after each printing process and, as mentioned above, amounts to half the width of the torsional actuator 10 in the direction indicated by the arrow A. Following the printing process, the actuators are separated along the parting lines 28, the relevant connecting surfaces protruding automatically, as in the case of the masks of FIG. 5, so that the head contacts 30 to 34 can be established immediately. A disadvantage of this second mask arrangement is that on the left-hand side or right-hand side in FIG. 6 a part of the width of the displacement cannot be used. As mentioned above, the external connections are formed in the same manner as shown in FIG. 5, with this difference that there are two connective areas 30 which require two head contacts 30 which must be interconnected. The sequence of the masks can be selected as follows: mask 35, not displaced; mask 35, displaced; mask 35, not displaced; mask 35, displaced; . . . , mask 35, not displaced, mask 35, displaced; mask 36, not displaced; mask 36, displaced; . . . , mask 36, displaced. Thus, it is obvious that an exchange of mask 35 for mask 36 must be carded out once, in the centre of the actuator.

The characteristic features of the invention, as disclosed in the above description, in the FIGS. 1 to 7 and in the Claims, may either individually or in any combination be essential to the realisation of the various embodiments of the invention.

We claim:

1. A torsional actuator of generally rectangular cross-section transverse to a longitudinal axis thereof, said transverse cross-section having horizontal and vertical center-lines which define first and second quadrants above the horizontal center-line and respectively to the right and left of the vertical center-line, and third and fourth quadrants below the horizontal center-line and respectively to the left and right of the vertical center-line; said actuator comprising:

a series of at least four layers of monolithic ceramic piezeo-electric material, said layers being stacked in the direction of said vertical center-line;

a series of substantially planar electrodes interleaved between the piezeo-electric layers, alternate ones of said electrodes as seen in said cross-section extending uninterrupted across said vertical center-line and serving as reference potential electrodes, the remaining electrodes being interrupted at said vertical center-line so as to form respective groups of control electrodes in each of said quadrants; and a plurality of externally accessible head contacts for supplying reference potential and control voltages to said electrodes to cause said piezeo-electric layers to produce twisting of said actuator about said longitudinal axis; a first head contact being mounted on a right side face of said actuator and making electrical contact with each of the control electrodes in said first quadrant, a second head contact being mounted on a left side face said actuator and making electrical contact with each of the control electrodes in said second quadrant, a third head contact being mounted on a front face of said actuator to the left of said longitudinal axis and making electrical contact with each of the control electrodes in said third quadrant, a fourth head contact being mounted on the front face of said actuator to the right of said longitudinal axis and making electrical contact with each of the control electrodes in said fourth quadrant, and a fifth head contact being mounted on the front face of said actuator and making electrical contact with each of said reference potential electrodes;

said fifth head contact being for supplying reference potential to each of the reference potential electrodes, the remaining head contacts being for supplying control voltages of opposite pluralities to the control electrodes which, as seen as said cross-section, are on opposite sides of said vertical center-line.

2. A torsional actuator as claimed in claim 1, further comprising a pair of outer electrodes respectively extending over external surfaces of the first and last of said piezeo-electric layers, each of said outer electrodes being in electrical contact with said fifth head contact so as to be supplied thereby with said reference potential.

3. A torsional actuator as claimed in claim 2, wherein each of said outer electrodes have projecting edge portions which form connective surfaces for contacting said fifth head contact.

4. A torsional actuator as claimed in claim 1, having a length in the direction of said longitudinal axis and a width transverse to said axis such that the ratio of the length to the width ranges between 1 and 3.

5. A torsional actuator as claimed in claim 1, having a length in the direction of said longitudinal axis and a width transverse to said axis such that the ratio of the length to the width is approximately 0.9, at which ratio a torsional twist angle of said actuator is maximized.

6. A torsional actuator as claimed in claim 1, having a rectangular base, a back face and a front face; the back face being rigidly fixed in position so as to prevent movement thereof during torsional twist of said actuator.

7. A torsional actuator as claimed in claim 1, having a trapezoidal base, a back face and a front face which is wider than the back face; the back face being rigidly fixed in position so as to prevent movement thereof during torsional twist of said actuator.

8. A torsional actuator as claimed in claim 7, wherein the front face is twice the width of the back face; thereby resulting in an increased torsional twist angle of said actuator as compared with the torsional twist angle obtained when said actuator has a rectangular base.

* * * * *